(12) United States Patent
Rassel et al.

(10) Patent No.: US 8,188,591 B2
(45) Date of Patent: May 29, 2012

(54) INTEGRATED STRUCTURES OF HIGH PERFORMANCE ACTIVE DEVICES AND PASSIVE DEVICES

(75) Inventors: Robert M. Rassel, Colchester, VT (US); Anthony K. Stamper, Williston, VT (US); Daniel S. Vanslette, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/835,306

(22) Filed: Jul. 13, 2010

(65) Prior Publication Data

US 2012/0013017 A1    Jan. 19, 2012

(51) Int. Cl.
*H01L 23/04* (2006.01)
(52) U.S. Cl. ............... 257/698; 257/778; 257/E23.011; 257/E21.511; 438/108
(58) Field of Classification Search .......... 257/698, 257/778, E23.011, E21.511; 438/108
See application file for complete search history.

(56) References Cited

U.S. PATENT DOCUMENTS

| | | | |
|---|---|---|---|
| 6,504,096 B2 | 1/2003 | Okubora | |
| 7,023,706 B2 | 4/2006 | Negishi et al. | |
| 7,492,242 B2 | 2/2009 | Carpentier | |
| 7,638,364 B2 | 12/2009 | Kwon et al. | |
| 7,759,212 B2 * | 7/2010 | Lin et al. | 438/384 |
| 2003/0059976 A1 | 3/2003 | Nathan et al. | |
| 2003/0081389 A1 | 5/2003 | Nair et al. | |
| 2005/0001331 A1 | 1/2005 | Kojima et al. | |
| 2007/0096160 A1 | 5/2007 | Beroz et al. | |
| 2008/0084677 A1 | 4/2008 | Ho et al. | |
| 2008/0150623 A1 | 6/2008 | Lin et al. | |
| 2010/0123215 A1 * | 5/2010 | Pan et al. | 257/532 |
| 2011/0024887 A1 * | 2/2011 | Chi et al. | 257/684 |
| 2011/0068433 A1 * | 3/2011 | Kim et al. | 257/531 |

* cited by examiner

*Primary Examiner* — Trung Q Dang
(74) *Attorney, Agent, or Firm* — Anthony Canale; Roberts Mlotkowski Safran & Cole, P.C.

(57) ABSTRACT

Integrated structures having high performance CMOS active devices mounted on passive devices are provided. The structure includes an integrated passive device chip having a plurality of through wafer vias, mounted to a ground plane. The structure further includes at least one CMOS device mounted on the integrated passive device chip using flip chip technology and being grounded to the ground plane through the through wafer vias of the integrated passive device chip.

20 Claims, 2 Drawing Sheets

INTEGRATED STRUCTURES OF HIGH PERFORMANCE ACTIVE DEVICES AND PASSIVE DEVICES

FIELD OF THE INVENTION

The invention relates to semiconductor structures and, more particularly, to integrated structures comprising high performance CMOS active devices mounted on passive devices.

BACKGROUND

In current technology integration schemes, CMOS chips are mounted directly onto a substrate or ground plane using through wafer/silicon vias that are utilized by the CMOS chip for grounding directly to the substrate or ground plane. Depending on the integration scheme, integrated passive device chips are mounted either directly on the substrate or ground plane, or on the CMOS chip having active devices such as, for example, power amplifiers. The CMOS active devices (CMOS chip) are more advanced technology nodes than the integrated passive device chips. In either implementation, the CMOS chips are wire bond (WB) to signal lines, by use of bond pads placed about a perimeter of the CMOS chips.

Long wire bond leads add high inductance and resistance out of the active devices of the CMOS devices. Also, the use of wire bonds adds to poor thermal properties for heat transfer. Moreover the use of bond pads on the perimeter of the CMOS chip, in order to connect the wire bond leads from the CMOS devices to the signal lines, is a poor utilization of valuable real estate. Additionally, flip chip technology is more expensive packaging and less flexibility is provided if both chips require C4 connections.

Also, the use of through wafer/silicon vias by the CMOS chip makes it more difficult to scale the CMOS devices. This is basically due to the fact that the through wafer/silicon vias require redesign for each technology node. This results in the need to support through wafer/silicon vias in the CMOS devices, e.g., CMOS, RFCMOS, BiCMOS, throughout different technology nodes. That is, the through wafer/silicon vias in the CMOS devices need to be propagated and developed across multiple advanced technologies. This leads to less flexible designs and higher design and/or manufacturing costs.

Accordingly, there exists a need in the art to overcome the deficiencies and limitations described hereinabove.

SUMMARY

In a first aspect of the invention, a structure comprises an integrated passive device chip having a plurality of through wafer vias, mounted to a ground plane. The structure further comprises at least one CMOS device mounted on the integrated passive device chip using flip chip technology and being grounded to the ground plane through the through wafer vias of the integrated passive device chip.

In another aspect of the invention, a structure comprises a package substrate. The structure further comprises an integrated passive device chip mounted to the substrate package by a plurality of through wafer vias extending from a top surface to a bottom surface of the integrated passive device chip. The structure further comprises bond pads coupled to the integrated passive device chip and wire bonds leading from the bond pads to signal lines. The structure further comprises at least one CMOS device mounted on the integrated passive device chip using flip chip technology and grounded to the ground plane through the integrated passive device chip and electrically connected to the signal lines through the wire bonds extending from the integrated passive device chip.

In yet another aspect of the invention, a method of forming a structure comprises forming a plurality of through wafer vias in an integrated passive device chip. The method further comprises mounting the integrated passive device chip on a ground plane. The method further comprises mounting at least one CMOS device with active components on the integrated passive device chip using flip chip technology. The mounting grounds the CMOS device to the ground plane. The CMOS device is mounted to the integrated passive device chip on a surface remote from the ground plane.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of integrated structures of high performance CMOS active devices and passive devices, which comprises the structures of the present invention. In still further embodiments, a method in a computer-aided design system is provided for generating a functional design model of integrated structures of high performance CMOS active devices and passive devices. The method comprises generating a functional representation of the structural elements of integrated structures of high performance CMOS active devices and passive devices.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to integrated structures comprising high performance CMOS active devices and integrated passive device chips. In embodiments, the CMOS active devices (CMOS chip) are more advanced technology nodes than the integrated passive device chips. By implementing the present invention, it is possible to produce low cost front end modules that have quality passive devices while having features that support high current/power amplifier applications which needs to support high temperature/high current devices.

In implementation, the integrated passive device chip of any generation technology is provided as a base or substrate to house a flip chip, higher end CMOS chip containing high performance active device elements. In embodiments, the integrated passive device chip is attached (mounted) to a ground plane by through wafer/silicon vias (hereinafter referred to as through wafer vias). The integrated passive device chip is also bonded to the CMOS chip using flip chip technology (e.g., C4 or Cu pillars). The connections between the integrated passive device chip and the CMOS active devices provide low inductance electrical ground for the active devices such as, for example, power amplifier devices, compared to conventional structures which require wire bonds that have higher inductance and resistance. Also, by using the integrated passive device chip as a base, the CMOS chips can be devoid of through wafer vias.

In embodiments, the integrated passive device chip provides grounding and heat dissipation (through the integrated passive device chip) for the CMOS devices. More specifically, the integrated passive device chip acts as a heat sink to the ground plane for the CMOS devices. The integrated passive device chip also provides an output connection to the signal line. In this way, it is no longer necessary to use valuable real estate on the CMOS device for such connection. In addition, the wire bond can now be made shorter, which will reduce inductance and resistance. In addition, the CMOS chip can act as a shield for high inductance devices on the integrated passive device chip, thus eliminating the need for additional shields.

Moreover, the two chips solution allows a designer or fabricator to only have to support through wafer vias in the integrated passive device chip technology instead of propagating and developing it across multiple advanced technologies, e.g., CMOS, RFCMOS, BiCMOS. In this way, it is now possible to scale the CMOS devices without the need for redesign of the through wafer vias. This allows the flexibility for a designer or fabricator to use a base which caters to multiple CMOS technologies, which have a variety of fabrication techniques and road maps. This also allows the designer to rapidly (>2× advantage) redesign or tweak electrical parameters of their design.

Figure 1:
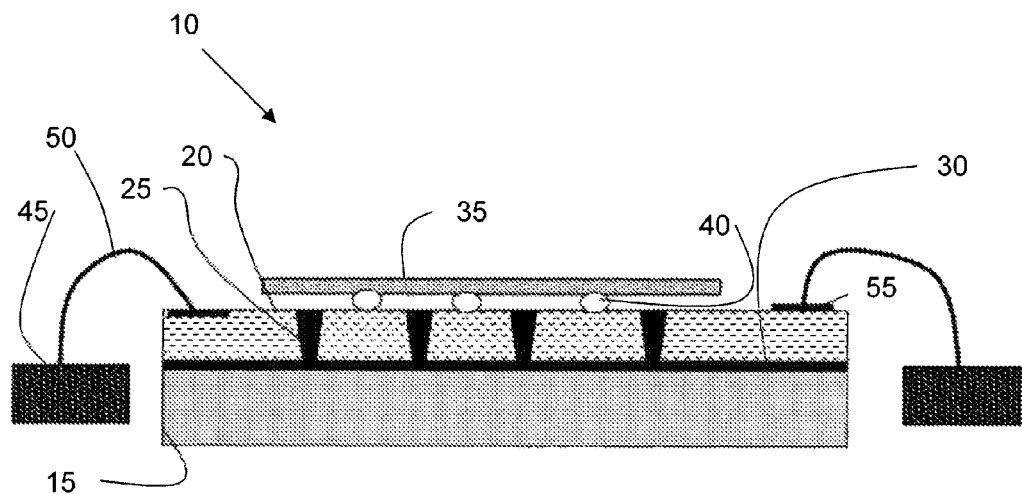
FIG. 1 shows a structure in accordance with aspects of the present invention.

FIG. 1 shows a structure in accordance with aspects of the present invention. In particular, the structure 10 includes a package substrate or ground plane 15 and an integrated passive device chip 20 mounted to the ground plane 15. In this way, the integrated passive device chip 20 acts as a base of the structure 10. The integrated passive device chip 20 includes a plurality of through wafer vias 25, connecting to a metal line back plane 30. The metal line back plane 30 is connected to the package substrate or ground plane 15. In embodiments, inductors can be moved to the integrated passive device chip 20.

In embodiments, the through wafer vias 25 can be any appropriate metal such as, for example, tungsten. Also, in embodiments, the through wafer vias 25 can be a plurality of different through wafer vias 25 extending through the integrated passive device chip 20, from a top side to a bottom side. The through wafer vias 25 do not have to be insulated; although, in embodiments, insulation may be provided when connected to devices within the integrated passive device chip 20, for example. Although four through wafer vias 25 are shown, the present invention is not limited to any specific number of through wafer vias 25.

A CMOS chip 35 with active devices such as, for example, power amplifiers, RF devices, switches, etc., is mounted (bonded) to the integrated passive device chip 20 using technologies such as, for example, C4s or copper pillars 40. CMOS chip 35 is remotely positioned from the ground plane 15 and does not make direct contact thereto, since it is mounted to the integrated passive device chip 20. By using the integrated passive device chip 20 as a base, the CMOS chip 35 (or any other integrated monolithic chip) can be devoid of through wafer vias which are customarily required to connect to the metal back plane for grounding of the active devices, amongst other functions. As such, it is now possible to scale the CMOS devices without the need for the redesign of the through wafer vias.

The C4s or copper pillars 40 allow the CMOS chip 35 to integrate or connect with the passive devices on the integrated passive device chip 20. In embodiments, the C4s or copper pillars 40 can also connect directly to one or more of the through wafer vias 25, depending on the design of the package and desired functionalities. The C4s or copper pillars 40 also act as an integration scheme with the integrated passive device chip 20 and, in embodiments, output connection to a signal line 45 through bond pads 55 mounted on the integrated passive device chip 20. The C4s or copper pillars 40 also provide low inductance ground.

In embodiments, the integrated passive device chip 20 can connect to the signal line 45 by wire bonds 50. Advantageously, in the integration scheme of the present invention it is possible to use the less valuable real estate (e.g., chip area) of the integrated passive device chip 20 for contact pads 55, to connect to the signal line 45. This is compared to using the more costly real estate of the CMOS chip 35. Also, the wire bonds 50 from the integrated passive device chip 20 to the signal line 45 is shorter, compared to conventional structures which, in turn, reduces inductance and resistance of the structure 10.

The CMOS chip 35 can act as a shield for devices on the integrated passive device chip 20. For example, the CMOS chip 35 can shield inductors that are on the integrated passive device chip 20. This eliminates the need for specially designed packages that are designed to shield the sensitive devices on the integrated passive device chip 20 such as, for example, inductors. Also, in embodiments, the integrated passive device chip 20 acts as a base technology for the grounding and heat dissipation (through the integrated passive device chip) for the CMOS chip 35. In addition, the integrated passive device chip 20 and accompanying through wafer vias 25 provides the flexibility to be used with any CMOS technology or node.

Figure 2:
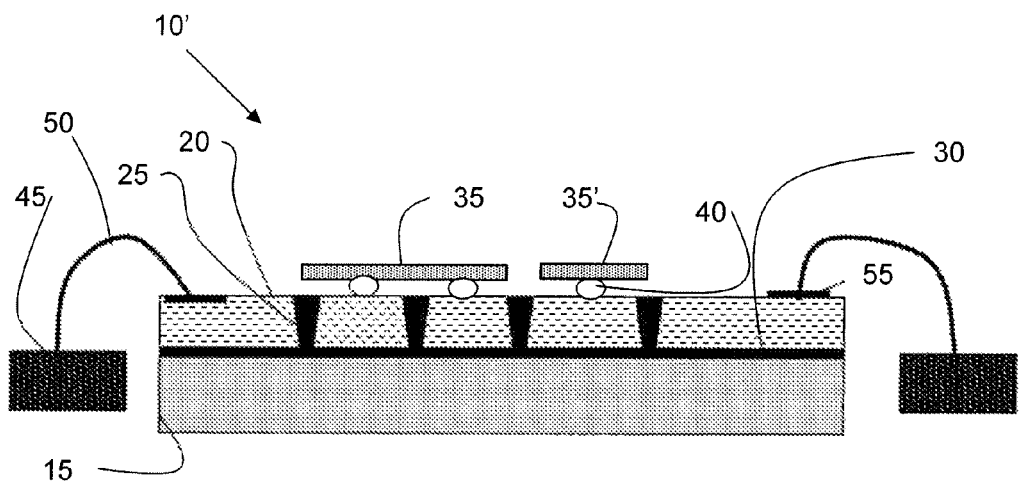
FIG. 2 shows a structure in accordance with aspects of the present invention.

FIG. 2 shows another structure in accordance with aspects of the present invention. In particular, the structure 10' includes a package substrate or ground plane 15 and an integrated passive device chip 20 mounted to the ground plane 15. In this way, the integrated passive device chip 20 acts as a base of the structure 10'. The integrated passive device chip 20 includes a plurality of through wafer vias 25, connecting to a metal line back plane 30. The metal line back plane 30 is connected to the package substrate or ground plane 15. As described above, the through wafer vias 25 can be any appropriate metal and can be a plurality of different through wafer vias 25 extending through the integrated passive device chip 20, from a top side to a bottom side.

In this embodiment, a plurality of CMOS chips 35 and 35' with active devices such as, for example, power amplifiers, RF devices, switches, etc., are mounted (bonded) to the integrated passive device chip 20 using technologies such as, for example, C4s or copper pillars 40. Although only two CMOS chips are shown, it should be well understood by those of ordinary skill in the art that CMOS chips 35 and 35' may represent more than two CMOS chips. As discussed above, in this integration scheme, it is possible to eliminate the through wafer vias in the CMOS chips (or any other integrated monolithic chip) which are customarily required to connect to the metal back plane for grounding of the active devices, amongst other functions.

The C4s or copper pillars 40 provide the same advantages as discussed above, e.g., integrate with the integrated passive device chip 20, provide low inductance ground, etc. The C4s or copper pillars 40 can connect directly to one or more of the through wafer vias 25, depending on the design of the package and desired functionalities.

In embodiments, the integrated passive device chip 20 can connect to the signal line 45 by wire bond 50. Again, in this type of integration scheme it is possible to use the less valuable real estate (e.g., chip area) of the integrated passive device chip 20 for contact pads 55, to connect to the signal line 45. Also, the wire bonds 50 from the integrated passive device chip 20 to the signal line 45 is shorter, compared to conventional structures which, in turn, reduces inductance and resistance of the structure 10. The CMOS chips 35 and 35' can also act as a shield for devices on the integrated passive device chip 20.

The structures of FIGS. 1 and 2 can be manufactured using conventional technologies. For example, the through wafer vias 25 in the integrated passive device chip 20 can be formed using conventional lithographic and etching techniques. The integrated passive device chip 20 can be connected to the signal lines 45 using conventional wire bonding techniques. Also, the integration of the integrated passive device chip 20 and the CMOS chip can be provided using known flip chip technology. The structure of the present invention, using the above fabrication techniques, provides many advantages over conventional systems, as discussed above.

Figure 3:
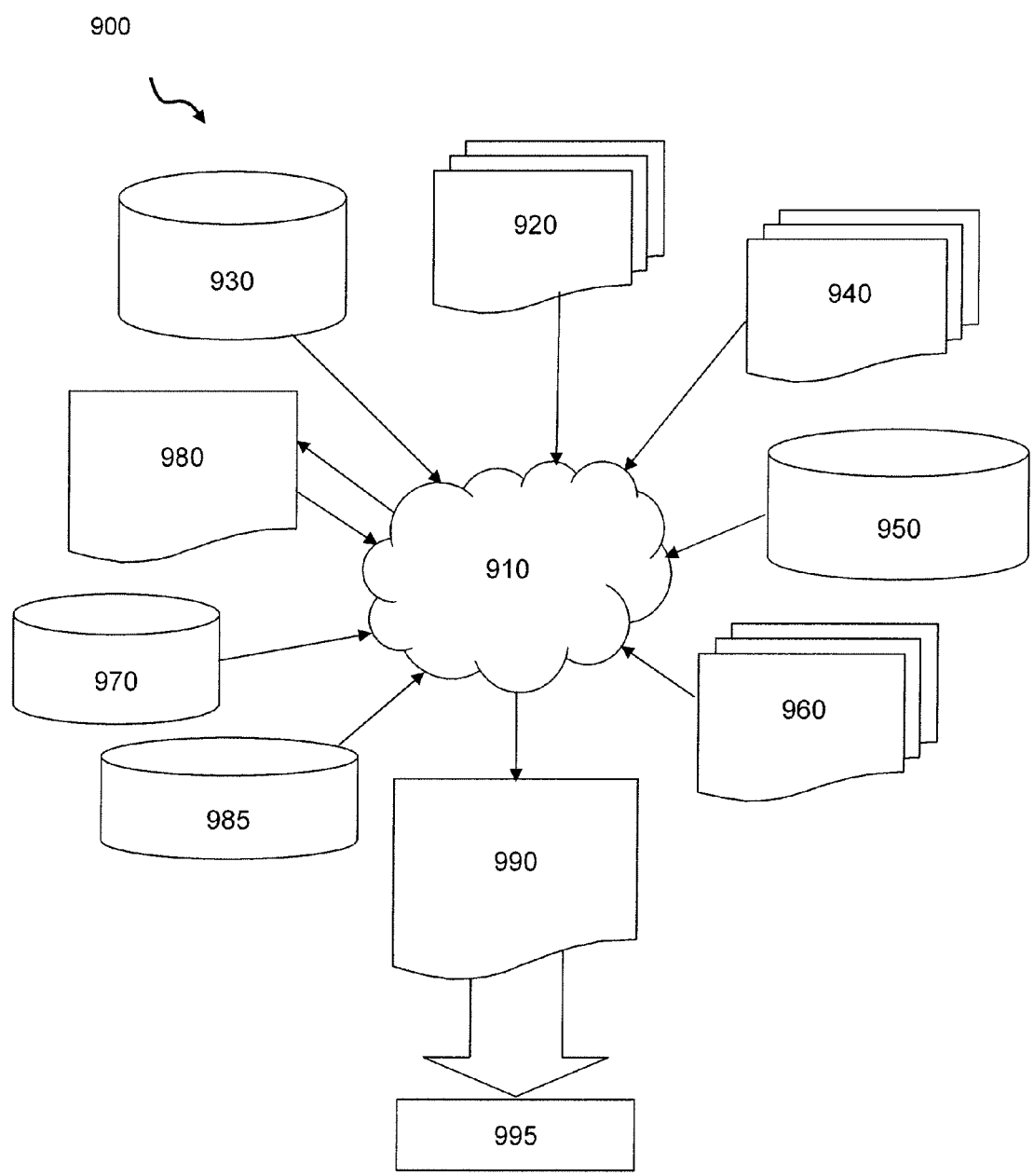
FIG. 3 is a flow diagram of a design process used in semiconductor design, manufacture, and/or test.

FIG. 3 is a flow diagram of a design process used in semiconductor design, manufacture, and/or test. FIG. 3 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1 and 2. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 and 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1 and 2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 990 may comprise a compiled, executable HDL simulation model that functionally simulates the devices shown in FIGS. 1 and 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure comprising:
   an integrated passive device chip having a plurality of through wafer vias, mounted to a ground plane; and
   at least one CMOS device mounted on the integrated passive device chip using flip chip technology and being grounded to the ground plane through the through wafer vias of the integrated passive device chip.

2. The structure of claim 1, wherein the through wafer vias extend entirely through the integrated passive device chip.

3. The structure of claim 1, wherein the through wafer vias are non-insulated through wafer vias.

4. The structure of claim 1, wherein the integrated passive device chip is positioned between the at least one CMOS device and the ground plane such that the at least one CMOS device is remotely positioned from the ground plane and does not make direct contact thereto.

5. The structure of claim 1, wherein the through wafer vias are coupled to a metal back plane of the integrated passive device chip.

6. The structure of claim 1, wherein the ground plane is a package substrate.

7. The structure of claim 1, further comprising bond pads mounted to the integrated passive device chip and wire bonds leading from the bond pads to signal lines.

8. The structure of claim 7, wherein the at least one CMOS device is devoid of the bond pads and through wafer vias.

9. The structure of claim 1, wherein the at least one CMOS device is a shield for devices on the integrated passive device chip.

10. The structure of claim 1, wherein the at least one CMOS device is at least two CMOS devices.

11. The structure of claim 1, wherein the integrated passive device chip is a heat sink to the ground plane for the CMOS device.

12. A structure, comprising:
   a package substrate;
   an integrated passive device chip mounted to the substrate package by a plurality of through wafer vias extending from a top surface to a bottom surface of the integrated passive device chip;
   bond pads coupled to the integrated passive device chip and wire bonds leading from the bond pads to signal lines; and at least one CMOS device mounted on the integrated passive device chip using flip chip technology and being grounded to the ground plane through the integrated passive device chip and electrically connected to the signal lines through the wire bonds extending from the integrated passive device chip.

13. The structure of claim 12, wherein the through wafer vias extend entirely through the integrated passive device chip.

14. The structure of claim 12, wherein the through wafer vias are non-insulated through wafer vias.

15. The structure of claim 12, wherein the at least one CMOS device is mounted to a surface of the integrated passive device chip, opposite of the package substrate.

16. The structure of claim 12, wherein the through wafer vias are coupled to a metal back plane of the integrated passive device chip.

17. The structure of claim 12, wherein the package substrate is a ground plane.

18. The structure of claim 12, wherein the at least one CMOS device is devoid of the bond pads and through wafer vias.

19. The structure of claim 12, wherein the at least one CMOS device is a shield for devices on the integrated passive device chip.

20. A method of forming a structure, comprising:
forming a plurality of through wafer vias in an integrated passive device chip;
mounting the integrated passive device chip on a ground plane; and
mounting at least one CMOS device with active components on the integrated passive device chip using flip chip technology, the mounting grounds the at least one CMOS device to the ground plane, wherein the at least one CMOS device is mounted to the integrated passive device chip on a surface remote from the ground plane.

* * * * *